(12) United States Patent
Lu et al.

(10) Patent No.: US 12,389,701 B2
(45) Date of Patent: Aug. 12, 2025

(54) PHOTOSENSITIVE DEVICE WITH COLLIMATOR LAYER AND LENS ARRAY

(71) Applicant: AUO Corporation, Hsinchu (TW)

(72) Inventors: Shih-Hua Lu, Hsinchu (TW); Chao-Chien Chiu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 467 days.

(21) Appl. No.: 17/862,423

(22) Filed: Jul. 12, 2022

(65) Prior Publication Data

US 2023/0026699 A1  Jan. 26, 2023

Related U.S. Application Data

(60) Provisional application No. 63/224,977, filed on Jul. 23, 2021.

(30) Foreign Application Priority Data

Dec. 21, 2021  (TW) .................................. 110147983

(51) Int. Cl.
    *H10F 39/00*    (2025.01)
    *G06V 40/13*    (2022.01)
    *H10F 39/12*    (2025.01)

(52) U.S. Cl.
    CPC ......... *H10F 39/806* (2025.01); *H10F 39/198* (2025.01); *H10F 39/805* (2025.01); *H10F 39/8057* (2025.01); *H10F 39/8063* (2025.01); *G06V 40/1318* (2022.01)

(58) Field of Classification Search
CPC ........... H01L 27/14625; H01L 27/1462; H01L 27/14623; H01L 27/14627; H01L 27/14678; G06V 40/1318; G06V 40/1341; G06F 3/0412; H10F 39/806; H10F 39/198; H10F 39/805; H10F 39/8057; H10F 39/8063
See application file for complete search history.

(56) References Cited

U.S. PATENT DOCUMENTS

| | | | |
|---|---|---|---|
| 7,113,333 | B2 | 9/2006 | Kamijima |
| 9,728,568 | B2 | 8/2017 | Hirano et al. |
| 9,941,318 | B2 | 4/2018 | Hirano et al. |
| 10,170,511 | B1 | 1/2019 | Huang et al. |

(Continued)

FOREIGN PATENT DOCUMENTS

| | | |
|---|---|---|
| CN | 1591169 | 3/2005 |
| CN | 101273297 | 9/2008 |

(Continued)

*Primary Examiner* — Jennifer D Bennett
(74) *Attorney, Agent, or Firm* — JCIPRNET

(57) ABSTRACT

A photosensitive device includes a first photosensitive unit, a first collimator layer, a first lens, and a first dummy lens. The first photosensitive unit includes a first photosensitive component and a first control circuit. The first control circuit is electrically connected to the first photosensitive component. The first collimator layer is located above the first photosensitive component and has a first pinhole and a first dummy pinhole. The first lens is located above the first collimator layer and overlapping with the first photosensitive component and the first pinhole in a first direction. The first dummy lens is located above the first collimator layer and overlapping with the first dummy pinhole in the first direction.

18 Claims, 10 Drawing Sheets

(56) References Cited

U.S. PATENT DOCUMENTS

| | | | |
|---|---|---|---|
| 10,332,924 | B2 | 6/2019 | Hirano et al. |
| 11,037,975 | B2 | 6/2021 | Hirano et al. |
| 11,403,869 | B2 * | 8/2022 | Wu .................... H01L 27/1462 |
| 2005/0078367 | A1 | 4/2005 | Kamijima |
| 2010/0128353 | A1 | 5/2010 | Nagata et al. |
| 2016/0027830 | A1 | 1/2016 | Hirano et al. |
| 2017/0287964 | A1 | 10/2017 | Hirano et al. |
| 2018/0190700 | A1 | 7/2018 | Hirano et al. |
| 2018/0358396 | A1 | 12/2018 | Huang et al. |
| 2019/0244996 | A1 | 8/2019 | Hirano et al. |
| 2021/0265407 | A1 | 8/2021 | Hirano et al. |
| 2021/0351216 | A1 * | 11/2021 | Hsieh ................ G06V 40/1324 |
| 2022/0115429 | A1 * | 4/2022 | Ogawa ............. H01L 27/14685 |
| 2022/0163701 | A1 * | 5/2022 | Akutsu ................ G06F 3/0416 |
| 2022/0293657 | A1 * | 9/2022 | Chou ............... H01L 27/14623 |

FOREIGN PATENT DOCUMENTS

| | | | |
|---|---|---|---|
| CN | 108337456 | | 1/2020 |
| CN | 111261651 | | 6/2020 |
| CN | 109003992 | | 9/2020 |
| CN | 212135461 | | 12/2020 |
| KR | 20210001849 U | * | 8/2021 |
| TW | M602235 | | 10/2020 |
| TW | 202114191 | | 4/2021 |
| TW | I758093 | | 3/2022 |

* cited by examiner

PHOTOSENSITIVE DEVICE WITH COLLIMATOR LAYER AND LENS ARRAY

CROSS-REFERENCE TO RELATED APPLICATION

This application claims the priority benefit of U.S. provisional application Ser. No. 63/224,977, filed on Jul. 23, 2021 and Taiwan application serial no. 110147983, filed on Dec. 21, 2021. The entirety of each of the above-mentioned patent applications is hereby incorporated by reference herein and made a part of this specification.

BACKGROUND

Technical Field

The present invention relates to a photosensitive device, and more particularly, to a photosensitive device including a lens.

Description of Related Art

The under-screen fingerprint sensing technology is to dispose photosensitive devices under a display panel of an electronic device. After the electronic device detects that the user touches the display screen, light source is controlled by the electronic device to emit light to illuminate the surface of the user's finger. The light will be reflected by the user's finger, and then the light will enter the photosensitive devices under the display panel. The photosensitive components in the photosensitive devices receive the light and generate signals. In some photosensitive devices, the light is better concentrated on the photosensitive components by the arrangement of lenses.

SUMMARY

The invention provides a photosensitive device, which can improve the problem of uneven shape of lenses and uneven shape of pinholes.

At least one embodiment of the present invention provides a photosensitive device. The photosensitive device includes a first photosensitive unit, a first collimator layer, a first lens, and a first dummy lens. The first photosensitive unit includes a first photosensitive component and a first control circuit. The first control circuit is electrically connected to the first photosensitive component. The first collimator layer is located above the first photosensitive component and has a first pinhole array, and the first pinhole array includes a first pinhole and a first dummy pinhole. A first lens array is located above the first collimator layer and includes the first lens and the first dummy lens. The first lens is overlapping with the first photosensitive component and the first pinhole in a first direction. The first dummy lens is overlapping with the first dummy pinhole in the first direction.

Based on the above, by the arrangement of the first dummy lens and the first dummy pinhole, the problem of uneven shape of lenses and the problem of uneven shape of pinholes can be improved.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
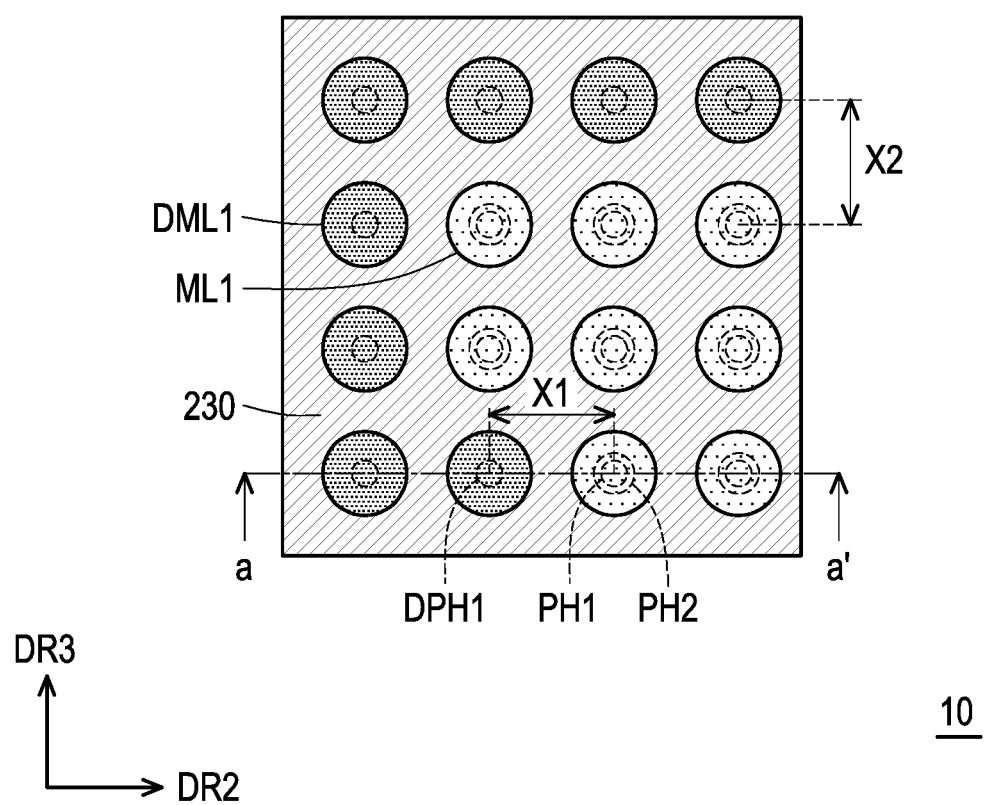
FIG. 1A is a schematic top view of a photosensitive device according to an embodiment of the present invention.
Figure 1B:
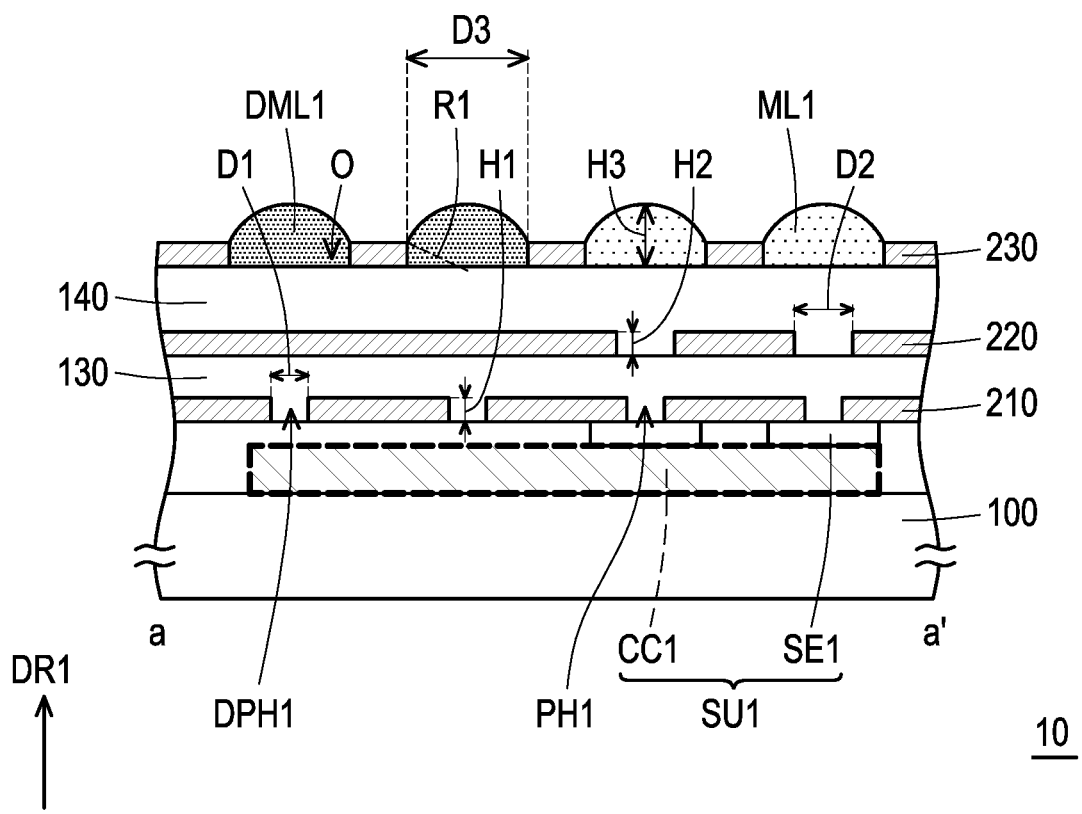
FIG. 1B is a schematic cross-sectional view of the photosensitive device of FIG. 1A.

FIG. 1A is a schematic top view of a photosensitive device according to an embodiment of the present invention. FIG. 1B is a schematic cross-sectional view of the photosensitive device of FIG. 1A. The photosensitive device 10 includes a plurality of pixels, and FIG. 1A and FIG. 1B only show one pixel of the photosensitive device 10.

Referring to FIG. 1A and FIG. 1B, the photosensitive device 10 includes a first photosensitive unit SU1, a first collimator layer 210, and a first lens array ML1A. In this embodiment, the photosensitive device 10 further includes a first substrate 100, a first planarization layer 130, a second collimator layer 220, a second planarization layer 140 and a light shielding structure 230.

The first photosensitive unit SU1 is located above the first substrate 100 and includes a first photosensitive component SE1 and a first control circuit CC1. The first photosensitive component SE1 may include any type of photosensitive component. The first control circuit CC1 includes, for example, an active component, a passive component or a combination thereof. The first control circuit CC1 is electrically connected to the first photosensitive component SE1. For example, the active component in the first control circuit CC1 is electrically connected to the electrode of the first photosensitive component SE1.

The first collimator layer 210 is located above the first photosensitive component SE1 and has a first pinhole array PH1A. In some embodiments, the material of the first collimator layer 210 includes black resin, black metal or other light-shielding materials. The first pinhole array PH1A includes a first pinhole PH1 and a first dummy pinhole DPH1 penetrating through the first collimator layer 210. In this embodiment, the first pinhole array PH1A includes first pinholes PH1 and first dummy pinholes DPH1 arranged in an array along a second direction DR2 and a third direction DR3.

The first pinhole PH1 is overlapping with the first photosensitive component SE1 in the first direction DR1 perpendicular to the first substrate 100, and the first dummy pinhole DPH1 is not overlapping with the first photosensitive component SE1 in the first direction DR1. In some embodiments, the first dummy pinhole DPH1 is overlapping with the first control circuit CC1 in the first direction DR1. The first pinholes PH1 and the first dummy pinholes DPH1 have the same first pitch X1 in the second direction DR2, and the first pinholes PH1 and the first dummy pinholes DPH1 have the same second pitch X2 in the third direction DR3. The first pitch X1 and the second pitch X2 are in a range of 10 micrometers to 30 micrometers.

In some embodiments, the method of forming the first collimator layer 210 includes: forming a light-shielding material layer, then forming a patterned photoresist layer on the surface of the light-shielding material layer, and then using the patterned photoresist layer as a mask to etch the aforementioned light-shielding material layer so as to form the first collimator layer 210 having the first pinhole array PH1A.

In this embodiment, due to the formation of the first dummy pinholes DPH1, the irregularity of the pattern of the patterned photoresist layer is not prone to occur. Specifically, if the first dummy pinholes DPH1 will not formed, the developer cannot be evenly distributed at the positions that the first pinholes PH1 need to be disposed and the position that the first pinholes PH1 doesn't need to be disposed when forming the patterned photoresist layer used for etching the light-shielding material layer. As a result, the shapes of the formed openings of the patterned photoresist layer are inconsistent. In this embodiment, since the first dummy pinholes DPH1 are need to be formed, the patterned photoresist layer used for etching the light-shielding material layer is not prone to the problem of inconsistent opening shapes, so that the first pinhole array PH1A formed by using the aforementioned patterned photoresist layer may have evenly distributed pinhole shapes and pinhole diameters. In other words, by the arrangement of the first dummy pinholes DPH1, the problems of uneven distribution of shapes and uneven distribution of hole sizes of the first pinholes PH1 can be improved.

In some embodiments, the diameters D1 of the first pinhole PH1 and the first dummy pinhole DPH1 are in a range of 2 micrometers to 6 micrometers. In some embodiments, the depth H1 of the first pinhole PH1 and the first dummy pinhole DPH1 is in a range of 450 angstroms to 850 angstroms. In some embodiments, the first pinhole PH1 and the first dummy pinhole DPH1 have the same diameter D1 and the same depth H1. In some embodiments, the variation of the diameter D1 of the first pinholes PH1 is within +0.2 micrometers and minus −0.2 micrometers.

In FIG. 1A and FIG. 1B, one pixel of the photosensitive device 10 includes eight first pinholes PH1 and eight first dummy pinholes DPH1, but the invention is not limited thereto. The number and the arrangement of the first pinholes PH1 and the first dummy pinholes DPH1 can be adjusted according to actual needs.

The first planarization layer 130 is located on the first collimator layer 210. In this embodiment, the first planarization layer 130 is filling into the first pinholes PH1 and the first dummy pinholes DPH1.

The second collimator layer 220 is located above the first collimator layer 210. In this embodiment, the second collimator layer 220 is located on the first planarization layer 130, and the first planarization layer 130 is located between the first collimator layer 210 and the second collimator layer 220. The second collimator layer 220 has second pinholes PH2 overlapping with the first pinholes PH1 in the first direction DR1. The diameter D2 of the second pinhole PH2 is larger than the diameter D1 of the first pinhole PH1. In some embodiments, the diameter D2 of the second pinhole PH2 is in a range of 3 micrometers to 15 micrometers. In some embodiments, the depth H2 of the second pinhole PH2 is in a range of 450 angstroms to 850 angstroms. In this embodiment, the second pinholes PH2 are not overlapping with the first dummy pinholes DPH1, and the second collimator layer 220 shields the first dummy pinholes DPH1.

In this embodiment, since the diameter D2 of the second pinhole PH2 is larger than the diameter D1 of the first pinhole PH1, the process window of the second collimator layer 220 is larger than that of the first collimator layer 210.

The second planarization layer 140 is located on the second collimator layer 220. In this embodiment, the second planarization layer 140 is filling into the second pinholes PH2.

The light shielding structure 230 is located on the second planarization layer 140. The light shielding structure 230 has a plurality of openings O overlapping with the second pinholes PH2, the first pinholes PH1 and the first dummy pinholes DPH1 in the first direction DR1. In some embodiments, the width D3 of the opening O is larger than the diameter D2 of the second pinhole PH2.

In some embodiments, the second collimator layer 220 and the light shielding structure 230 include the same light shielding material as the first collimator layer 210, but the invention is not limited thereto. In other embodiments, the second collimator layer 220 and the light shielding structure 230 include light shielding materials different from the first collimator layer 210.

The first lens array ML1A is located above the first collimator layer 210. In this embodiment, the first lens array ML1A is located on the second planarization layer 140 and disposed in the openings O of the light shielding structure 230. In this embodiment, the first lens array ML includes first lenses ML1 and first dummy lenses DML1 arranged in an array along the second direction DR2 and the third direction DR3, and the first lenses ML1 and the first dummy lenses DML1 are respectively disposed in the openings O.

The first lenses ML1 are overlapping with the first photosensitive components SE1, the first pinholes PH1 and the second pinholes PH2 in the first direction DR1. The first dummy lenses DML1 are overlapping with the first dummy pinhole DPH1 in the first direction DR1. The first dummy lenses DML1 are not overlapping with the first photosensitive components SE1 in the first direction DR1, and the first dummy lenses DML1 are overlapping with the first control circuit CC1 in the first direction DR1. The second collimator layer 220 is located between the first dummy pinholes DPH1 and the first dummy lenses DML1 in the first direction DR1, and shields the first dummy pinholes DPH1. Therefore, the negative influence of the light passing through the first dummy lenses DML1 on the first control circuit CC1 can be avoided.

The first lenses ML1 and the first dummy lenses DML1 have the same first pitch X1 in the second direction DR2, and the first lenses ML1 and the first dummy lenses DML1 have the same second pitch X2 in the third direction DR3.

In some embodiments, the method of forming the first lens array ML1A includes: forming a photoresist material layer, and then patterning the photoresist material layer to form the first lens ML1 and the first dummy lens DML1.

In this embodiment, due to the formation of the first dummy lenses DML1, the irregularity of the pattern of the first lens array ML1A is not prone to occur. Specifically, if the first dummy lens DML1 will not formed, the developer cannot be evenly distributed at the positions that the first lenses ML1 need to be disposed and the positions that the first lenses ML1 doesn't need to be disposed when forming the first lens array ML1A. As a result, the lens shapes of the formed first lens ML1 are inconsistent, for example, the surface of part of the first lens ML1 is not round enough. In this embodiment, since the first dummy lenses DML1 are need to be formed, the first lens array ML1A may have evenly distributed lens shapes and lens thicknesses. In other words, by the arrangement of the first dummy lenses DML1, the problems of uneven distribution of shapes and uneven distribution of thicknesses of the first lenses ML1 can be improved. In some embodiments, the variation of the curvature radius R1 of the first lenses ML1 is within +0.2 micrometers and −0.2 micrometers, the variation of the width of the first lenses ML1 is within +0.6 micrometers and −0.6 micrometers, and the variation of the thickness H3 of the first lenses ML1 is within +10% of the thickness H3 and −10% of the thickness H3.

In some embodiments, the curvature radius R1 of the first lens ML1 and the first dummy lens DML1 is in a range of 7 micrometers to 25 micrometers. In some embodiments, the thickness H3 of the first lens ML1 and the first dummy lens DML1 is in a range of 2 micrometers to 6 micrometers. In some embodiments, the first lens ML1 and the first dummy lens DML1 have the same curvature radius R1, the same thickness H3 and the same material.

Figure 2A:
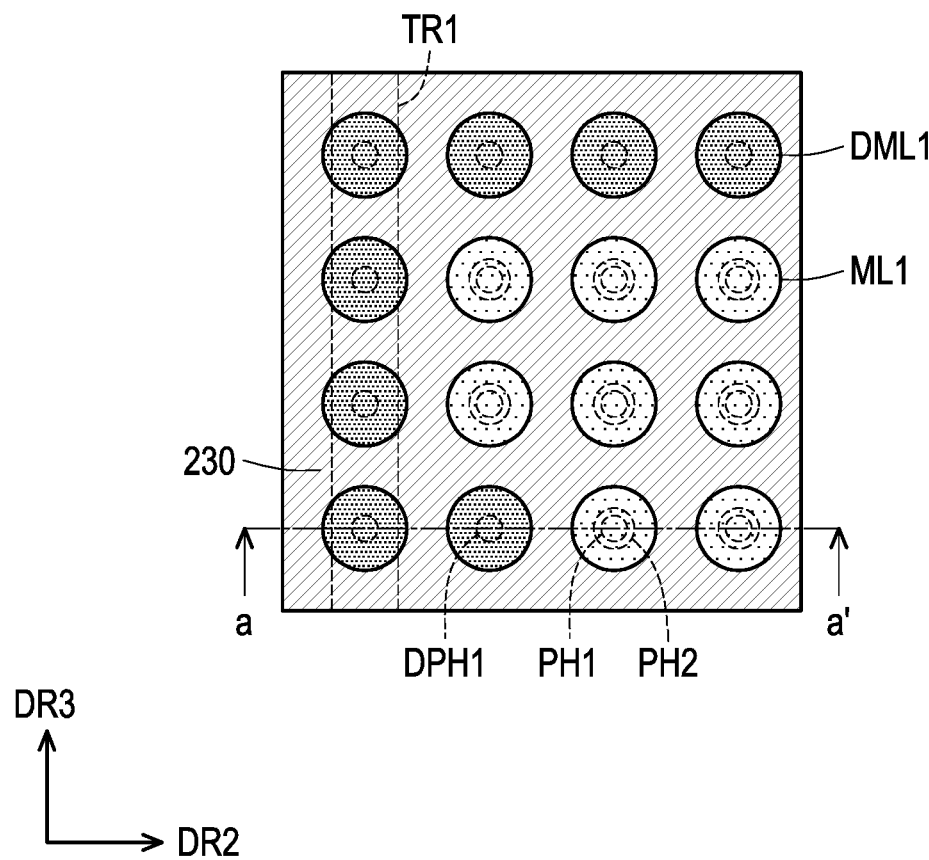
FIG. 2A is a schematic top view of a photosensitive device according to an embodiment of the present invention.
Figure 2B:
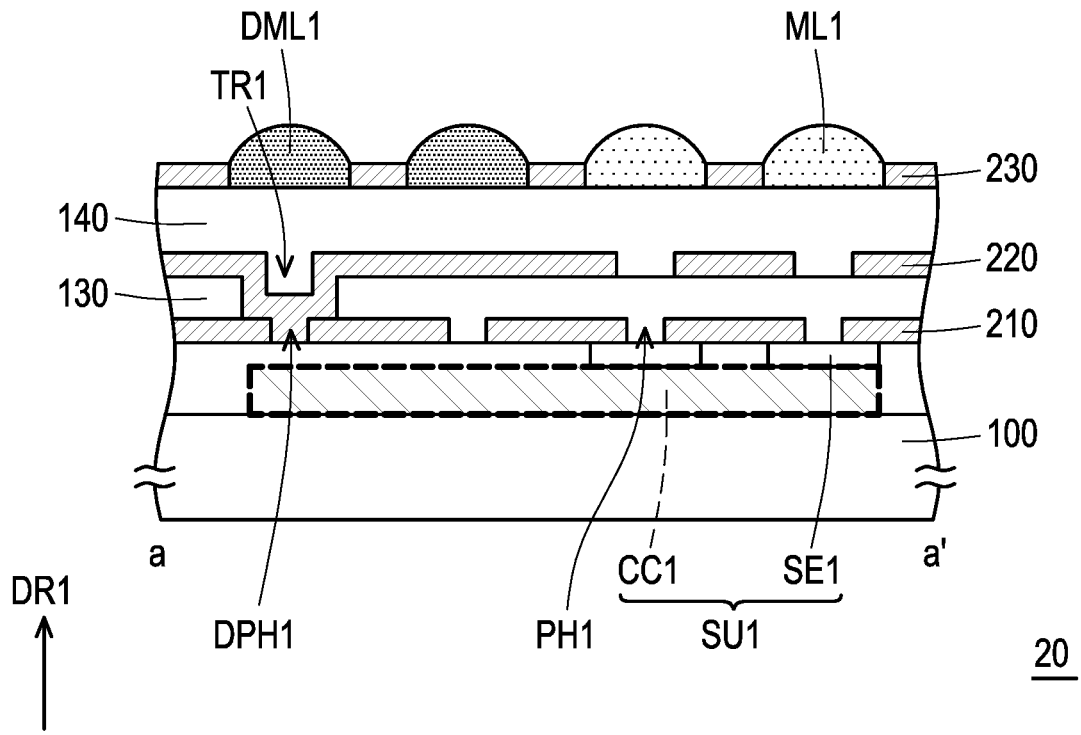
FIG. 2B is a schematic cross-sectional view of the photosensitive device of FIG. 2A.

FIG. 2A is a schematic top view of a photosensitive device according to an embodiment of the present invention. FIG. 2B is a schematic cross-sectional view of the photosensitive device of FIG. 2A. It should be noted that the embodiments of FIG. 2A and FIG. 2B follow the numeral references and parts of the embodiments of FIG. 1A and FIG. 1B, in which the same or similar numeral references are used to denote the same or similar elements, and the description of the same technical content is omitted. The description of the omitted parts can be found in the preceding embodiments and will not be repeated.

The main difference between the photosensitive device 20 of FIGS. 2A and 2B and the photosensitive device 10 of FIGS. 1A and 1B is that: the first planarization layer 130 of the photosensitive device 20 has a first trench TR1.

Referring to FIGS. 2A and 2B, the first planarization layer 130 is located between the first collimator layer 210 and the second collimator layer 220. The first planarization layer 130 has a first trench TR1, and the second collimator layer 220 is filling into the first trench TR1 and in contact with the first collimator layer 210. The first trench TR1 is applied to divide the first planarization layer 130 into different blocks, so as to avoid the bending of the photosensitive device 20 caused by the stress generated during the formation of the first planarization layer 130.

In some embodiments, the first trench TR1 of the first planarization layer 130 is overlapping with the first dummy pinholes DPH1, and the second collimator layer 220 is filling into the first dummy pinholes DPH1, but the invention is not limited thereto. In other embodiments, the first trench TR1 of the first planarization layer 130 is not overlapping with the first dummy pinholes DPH1. In some embodiments, the width of the first trench TR1 is in a range of 6 micrometers to 10 micrometers.

Figure 3A:
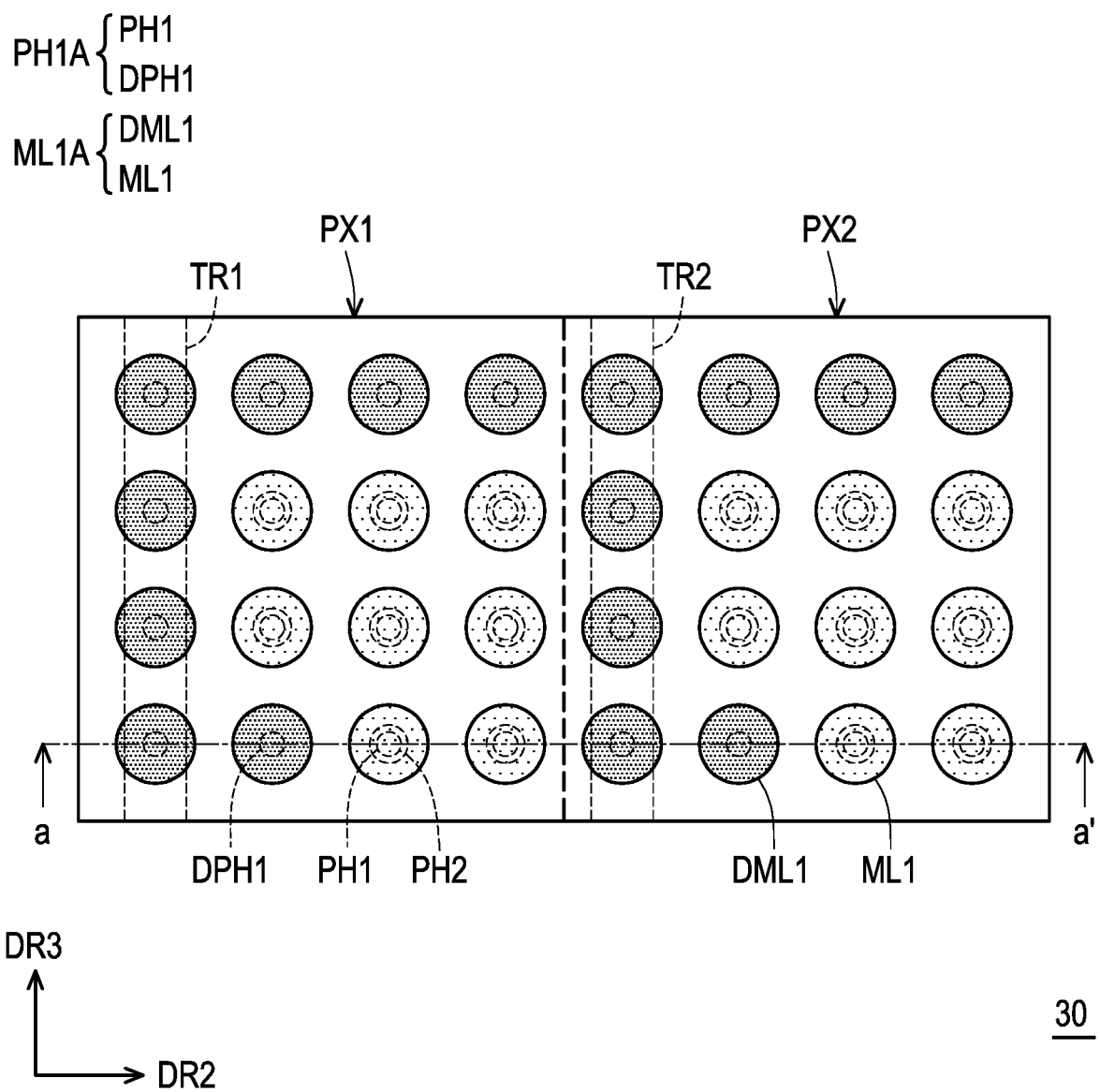
FIG. 3A is a schematic top view of a photosensitive device according to an embodiment of the present invention.
Figure 3B:
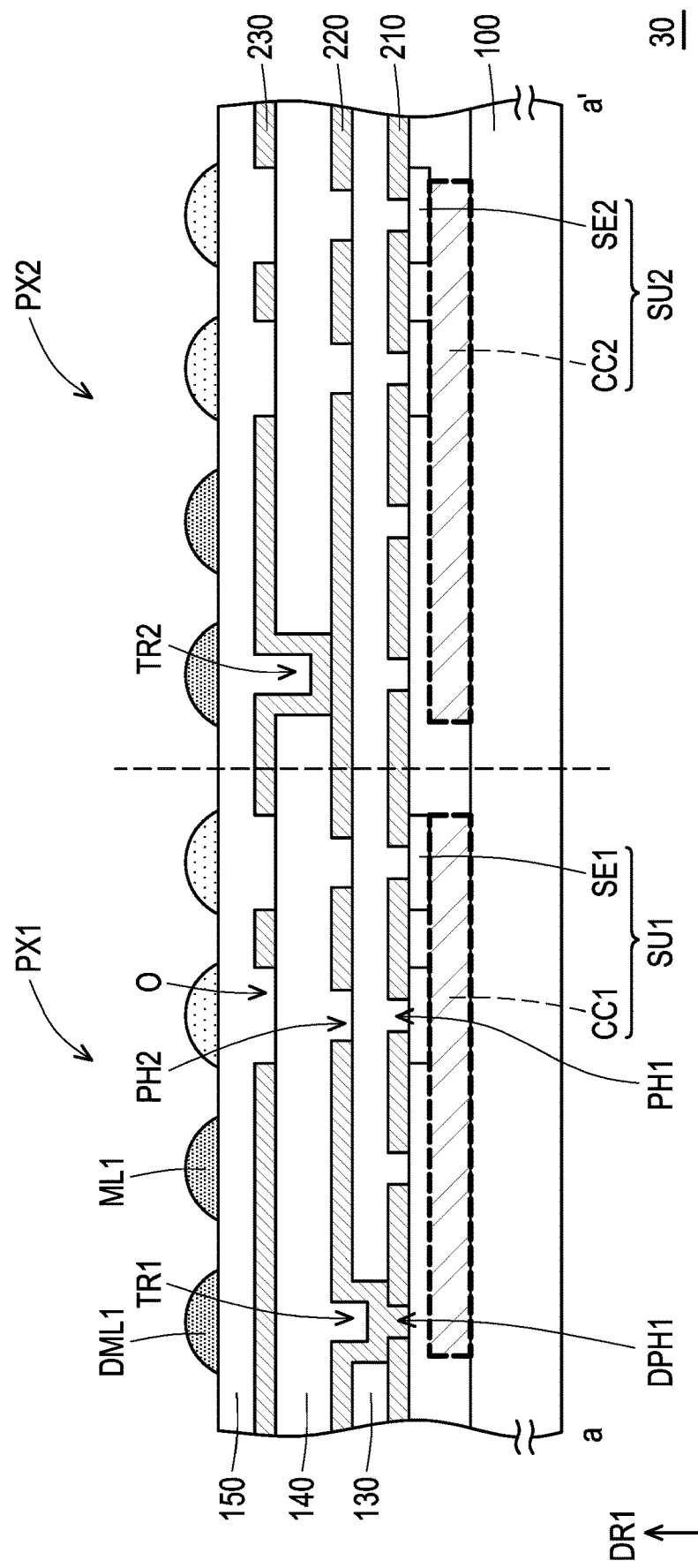
FIG. 3B is a schematic cross-sectional view of the photosensitive device of FIG. 3A.

FIG. 3A is a schematic top view of a photosensitive device according to an embodiment of the present invention. FIG. 3B is a schematic cross-sectional view of the photosensitive device of FIG. 3A. It should be noted that the embodiments of FIG. 3A and FIG. 3B follow the numeral references and parts of the embodiments of FIG. 2A and FIG. 2B, in which the same or similar numeral references are used to denote the same or similar elements, and the description of the same technical content is omitted. The description of the omitted parts can be found in the preceding embodiments and will not be repeated. The photosensitive device 30 includes a plurality of pixels, and FIG. 3A and FIG. 3B only show two pixels PX1 and PX2 of the photosensitive device 30.

The main difference between the photosensitive device 30 of FIGS. 3A and 3B and the photosensitive device 20 of FIGS. 2A and 2B is that: the second planarization layer 140 of the photosensitive device 30 has a second trench TR2.

In this embodiment, the photosensitive device 30 includes a first photosensitive unit SU1 and a second photosensitive unit SU2. The first photosensitive unit SU1 and the second photosensitive unit SU2 are located in the pixel PX1 and the pixel PX2, respectively. The first photosensitive unit SU1 and the second photosensitive unit SU2 are located above the first substrate 100. The first photosensitive unit SU1 includes a first photosensitive component SE1 and a first control circuit CC1 electrically connected to the first photosensitive component SE1. The second photosensitive unit SU2 includes a second photosensitive component SE2 and a second control circuit CC2 electrically connected to the second photosensitive component SE2.

In this embodiment, part of the first lenses ML1 is overlapping with the first photosensitive component SE1 and part of the first pinholes PH1 in the first direction DR1, and another part of the first lenses ML1 is overlapping with the second photosensitive component and another part of the first pinholes PH1 in the first direction DR1. The first dummy lenses DML1 are respectively overlapping with the corresponding first dummy pinholes DPH1 in the first direction DR1, and is not overlapped with the first photosensitive component SE1 and the second photosensitive component SE2.

The second planarization layer 140 is located on the second collimator layer 220. The second planarization layer 140 has a second trench TR2. The second trench TR2 is applied to divide the second planarization layer 140 into different blocks, so as to avoid the bending of the photosensitive device 30 caused by the stress generated when forming the first planarization layer 140. In some embodiments, the light shielding structure 230 is filling into the second trench TR2 and in contact with the second collimator layer 220.

In this embodiment, the second trench TR2 of the second planarization layer 140 and the first trenches TR1 of the first planarization layer 130 are respectively disposed in different pixels. In this embodiment, the second trench TR2 of the second planarization layer 140 is overlapping with the second photosensitive unit SU2, and the first trench TR1 of the first planarization layer 130 is overlapping with the first photosensitive unit SU1. In some embodiments, the width of the first trench TR1 and the width of the second trench TR2 are in the range of 6 micrometers to 10 micrometers.

In this embodiment, the photosensitive device 30 further includes a third planarization layer 150. The third planarization layer 150 is located on the light shielding structure 230. The first lenses ML1 and the first dummy lenses DML1 are located on the third planarization layer 150. The first lenses ML1 are overlapping with the openings O of the light shielding structure 230 in the first direction DR1, and the openings O are not overlapping with the first dummy pinholes DPH1 in the first direction DR1. In some embodiments, the first dummy lenses DML1 are not overlapping with the openings O of the light shielding structure 230 in the first direction DR1, but the invention is not limited thereto. In other embodiments, the first dummy lenses DML1 and the first lenses ML1 are respectively overlapped with the openings O of the light shielding structure 230 in the first direction DR1.

Figure 4A:
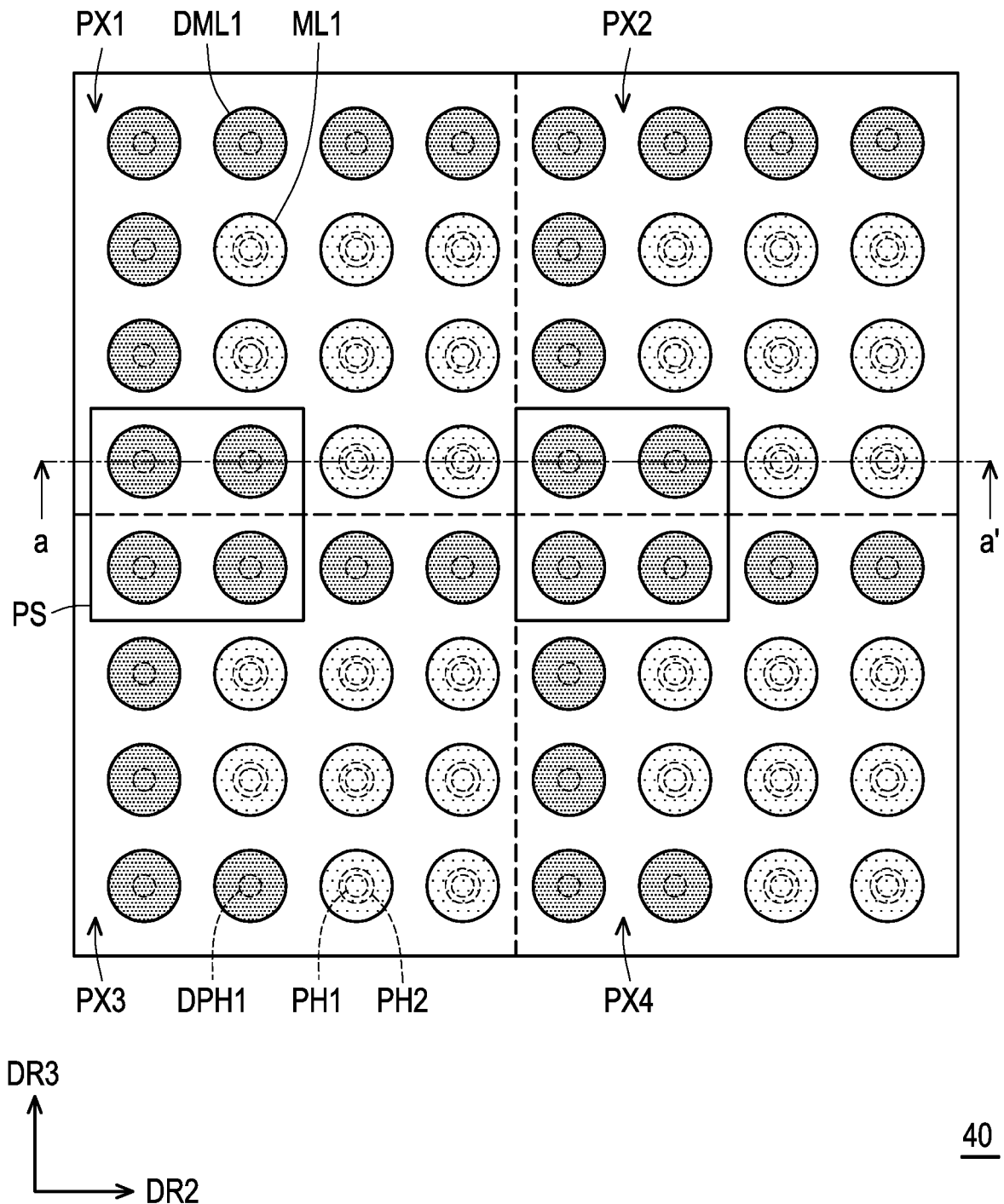
FIG. 4A is a schematic top view of a photosensitive device according to an embodiment of the present invention.
Figure 4B:
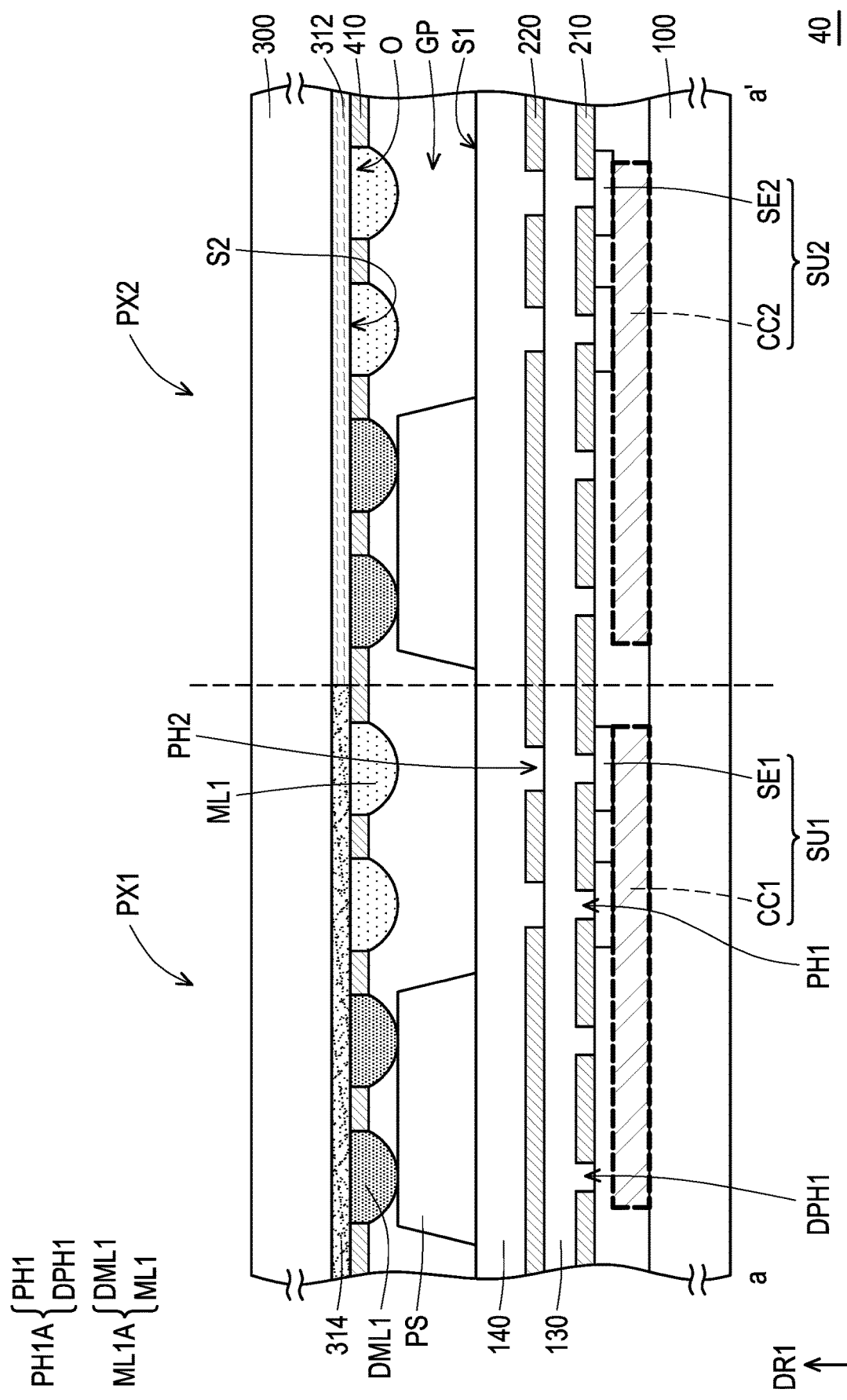
FIG. 4B is a schematic cross-sectional view of the photosensitive device of FIG. 4A.

FIG. 4A is a schematic top view of a photosensitive device according to an embodiment of the present invention. FIG. 4B is a schematic cross-sectional view of the photosensitive device of FIG. 4A. It should be noted that the embodiments of FIG. 4A and FIG. 4B follow the numeral references and parts of the embodiments of FIG. 3A and FIG. 3B, in which the same or similar numeral references are used to denote the same or similar elements, and the description of the same technical content is omitted. The description of the omitted parts can be found in the preceding embodiments and will not be repeated. The photosensitive device 40 includes a plurality of pixels, and FIG. 4A shows four pixels PX1, PX2, PX3, and PX4 of the photosensitive device 40.

The main difference between the photosensitive device 40 of FIGS. 4A and 4B and the photosensitive device 30 of FIGS. 3A and 3B is that: the photosensitive device 40 further includes a second substrate 300 and spacers PS, and the first lens array ML1A is disposed on the second substrate 300.

Referring to FIGS. 4A and 4B, the photosensitive device 40 further includes a second substrate 300, a filter component 312, a filter component 314 and a light shielding structure 410.

The second substrate 300 is disposed in corresponding to the first substrate 100. The filter component 312, the filter component 314 and the light shielding structure 410 are disposed on the second substrate 300. The filter component 312 and the filter component 314 are respectively disposed in the pixel PX2 and the pixel PX1. In some embodiments, filter component 312 and filter component 314 include filter components of different colors. In FIG. 4B, the pixel PX2 and the pixel PX1 are provided with a filter component 312 and a filter component 314. However, it does not mean that each pixel of the photosensitive device 40 must be provided with a filter component. Specifically, the light-sensing device 40 may be provided with a filter component in each pixel, or may be provided with a filter component in only some of the pixels.

The light shielding structure 410 is disposed on the filter component 312 and the filter component 314, and has a plurality of openings O overlapping with the second pinholes PH2, the first pinholes PH1 and the first dummy pinholes DPH1 in the first direction DR1.

In this embodiment, the first lens array ML1A is located on the filter component 312 and the filter component 314, and is disposed in the openings O of the light shielding structure 410. In this embodiment, the first lens array ML1A includes first lenses ML1 and first dummy lenses DML1 arranged in an array along the second direction DR2 and the third direction DR3, and the first lenses ML1 and the first dummy lenses DML1 are respectively disposed in the openings O. The filter component 312 and the filter component 314 are located between the second substrate 300 and the first lenses ML1 and between the second substrate 300 and the first dummy lenses DML1.

In this embodiment, there is a gap GP between the first substrate 100 and the second substrate 300. The gap GP has a first side S1 adjacent to the first substrate 100 and a second side S2 adjacent to the second substrate 300. The first photosensitive component SE1 and the second photosensitive component SE2 are located between the first side S1 of the gap GP and the first substrate 100. The first lenses ML1 and the first dummy lenses DML1 are located on the second side S2 of the gap GP. In some embodiments, the gap GP includes air. In some embodiments, the air in the gap GP is in a low vacuum state.

The spacers PS are located between the first substrate 100 and the second substrate 300. The first dummy lenses DML1 are in contact with the top surface of the spacers PS, and the first lens ML1 are not in contact with the top surface of the spacers PS.

Figure 5:
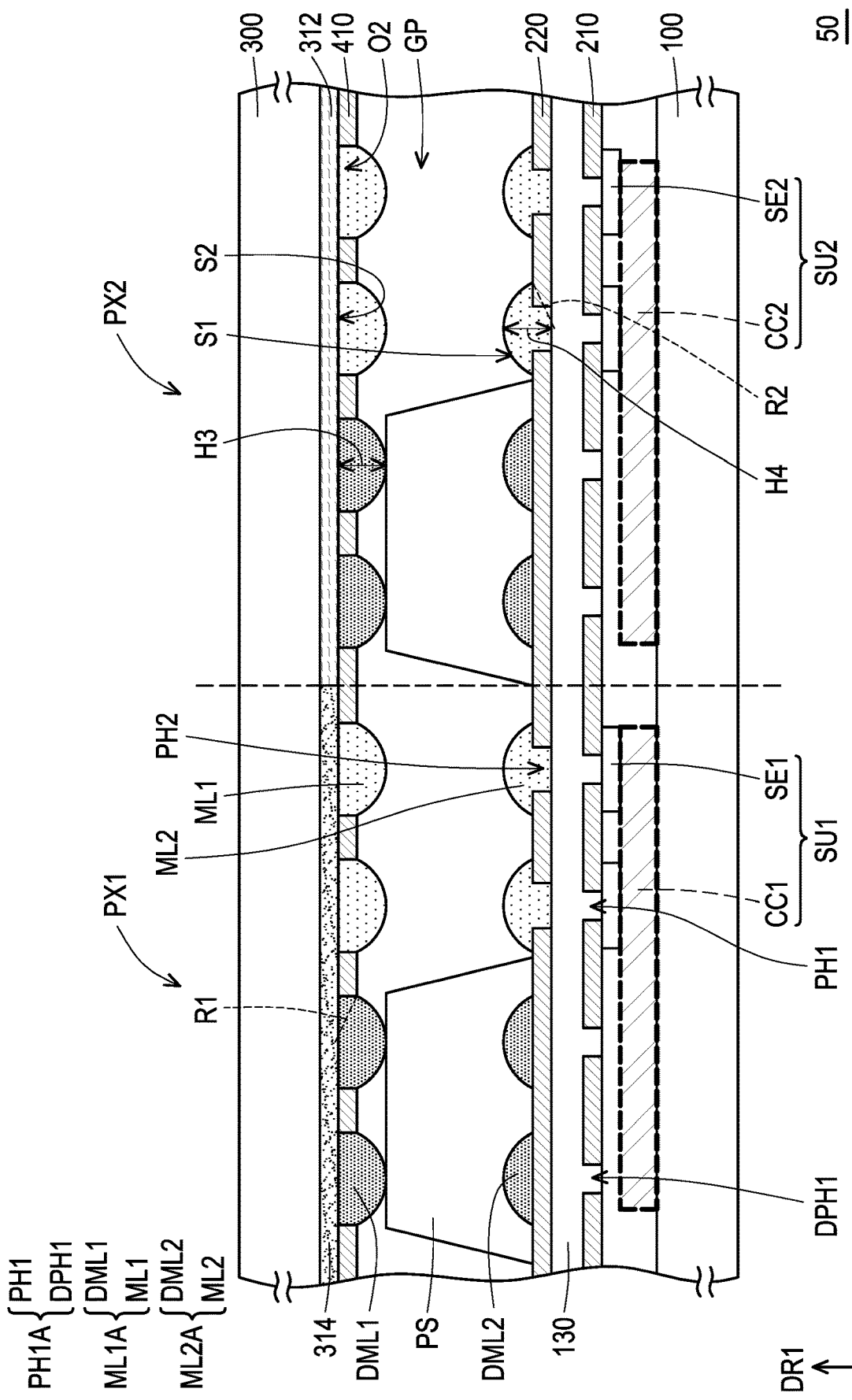
FIG. 5 is a schematic cross-sectional view of a photosensitive device according to an embodiment of the present invention.

FIG. 5 is a schematic cross-sectional view of a photosensitive device according to an embodiment of the present invention. It should be noted that the embodiments of FIG. 5 follow the numeral references and parts of the embodiments of FIG. 4A and FIG. 4B, in which the same or similar numeral references are used to denote the same or similar elements, and the description of the same technical content is omitted. The description of the omitted parts can be found in the preceding embodiments and will not be repeated. The photosensitive device 50 includes a plurality of pixels, and FIG. 5 only shows two pixels PX1 and PX2 of the photosensitive device 50.

The main difference between the photosensitive device 50 in FIG. 5 and the photosensitive device 40 in FIGS. 4A and 4B is that: the photosensitive device 50 further includes a second lens array ML2A.

Referring to FIG. 5, the second lens array ML2A is located above the first collimator layer 210. In this embodiment, the second lens array ML2A is disposed on the second collimator layer 220. In this embodiment, the second lens array ML2A includes the second lenses ML2 and the second dummy lenses DML2 arranged in an array along the second direction DR2 and the third direction DR3 (please refer to FIG. 4A). In some embodiments, the second lenses ML2 are filling into the second pinholes PH2 of the second collimator layer 220.

The first lenses ML1 and the second lenses ML2 are overlapping with the first photosensitive components SE1, the second photosensitive components SE2, the first pinholes PH1 and the second pinholes PH2 in the first direction DR1. The second dummy lenses DML2 are overlapping with the first dummy pinholes DPH1 and the first dummy lenses DML1 in the first direction DR1. The first dummy lenses DML1 and the second dummy lenses DML2 are not overlapping with the first photosensitive components SE1 and the second photosensitive components SE2 in the first direction DR1, and the first dummy lenses DML1 and the second dummy lenses DML2 are overlapping with the first control circuit CC1 and the second control circuit CC2 in the first direction DR1. The second collimator layer 220 is located between the first dummy pinholes DPH1 and the first dummy lenses DML1 and between the first dummy pinholes DPH1 and the second dummy lenses DML2 in the first direction DR1, and shields the first dummy pinholes DPH1. Therefore, the negative influence of the light passing through the first dummy lenses DML1 and the second dummy lenses on the first control circuit CC1 and the second control circuit CC2 can be avoided.

The first lenses ML1 and the first dummy lenses DML1 have the same first pitch X1 in the second direction DR2 (please refer to FIG. 4A), and the first lenses ML1 and the first dummy lenses DML1 have the same second pitch X2 in the third direction DR3 (please refer to FIG. 4A). 4A). Similarly, the second lenses ML2 and the second dummy lenses DML2 have the same first pitch X1 in the second direction DR2, and the second lenses ML2 and the second dummy lenses DML2 have the same second pitch X2 in the third direction DR3.

In some embodiments, the methods of forming the first lens array ML1A and the second lens array ML2A both include: forming a photoresist layer, and then patterning the aforementioned photoresist layer to form lenses and dummy lenses. In this embodiment, the first lens array ML1A and the second lens array ML2A are respectively formed above the second substrate 300 and above the first substrate 100. Then, the first substrate 100 and the second substrate 300 are combined together.

In this embodiment, by the arrangement of the first dummy lenses DML1 and the second dummy lenses DML2, the problem of uneven shapes and the problem of uneven thicknesses of the first lenses ML1 and the second lenses ML2 can be improved.

In some embodiments, the curvature radius R1 of the first lenses ML1 and the first dummy lenses DML1 and the curvature radius R2 of the second lenses ML2 and the second dummy lenses DML2 are in a range of 7 micrometers to 25 micrometers. In some embodiments, the thickness H3 of the first lenses ML1 and the first dummy lenses DML1 and the thickness H4 of the second lenses ML2 and the second dummy lenses DML2 are in a range of 2 micrometers to 6 micrometers. In some embodiments, the curvature radius R1 and the curvature radius R2 are the same or different, the thickness H3 and the thickness H4 are the same or different, and the materials of the first lenses ML1 and the first dummy lenses DML1 are the same or different from the material of the second lenses ML2 and the second dummy lenses DML2.

The first lenses ML1 and the first dummy lenses DML1 are located on the second side S2 of the gap GP adjacent to the second substrate 300, and the second lenses ML2 and the second dummy lenses DML2 are located on the first side S1 of the gap GP adjacent to the first substrate 100. The second lenses ML2 are overlapping with the first lenses ML1 in the first direction DR1, and the second dummy lenses DML2 are overlapping with the first dummy lenses DML1 in the first direction DR1. By overlapping the first lenses ML1 with the second lenses ML2, the light can be better focused on the first photosensitive components SE1 and the second photosensitive components SE2.

In this embodiment, the spacers PS are located between the first substrate 100 and the second substrate 300. The first dummy lenses DML1 are in contact with the top surface of the spacers PS, and the spacers PS cover the second dummy lenses DML2.

Figure 6:
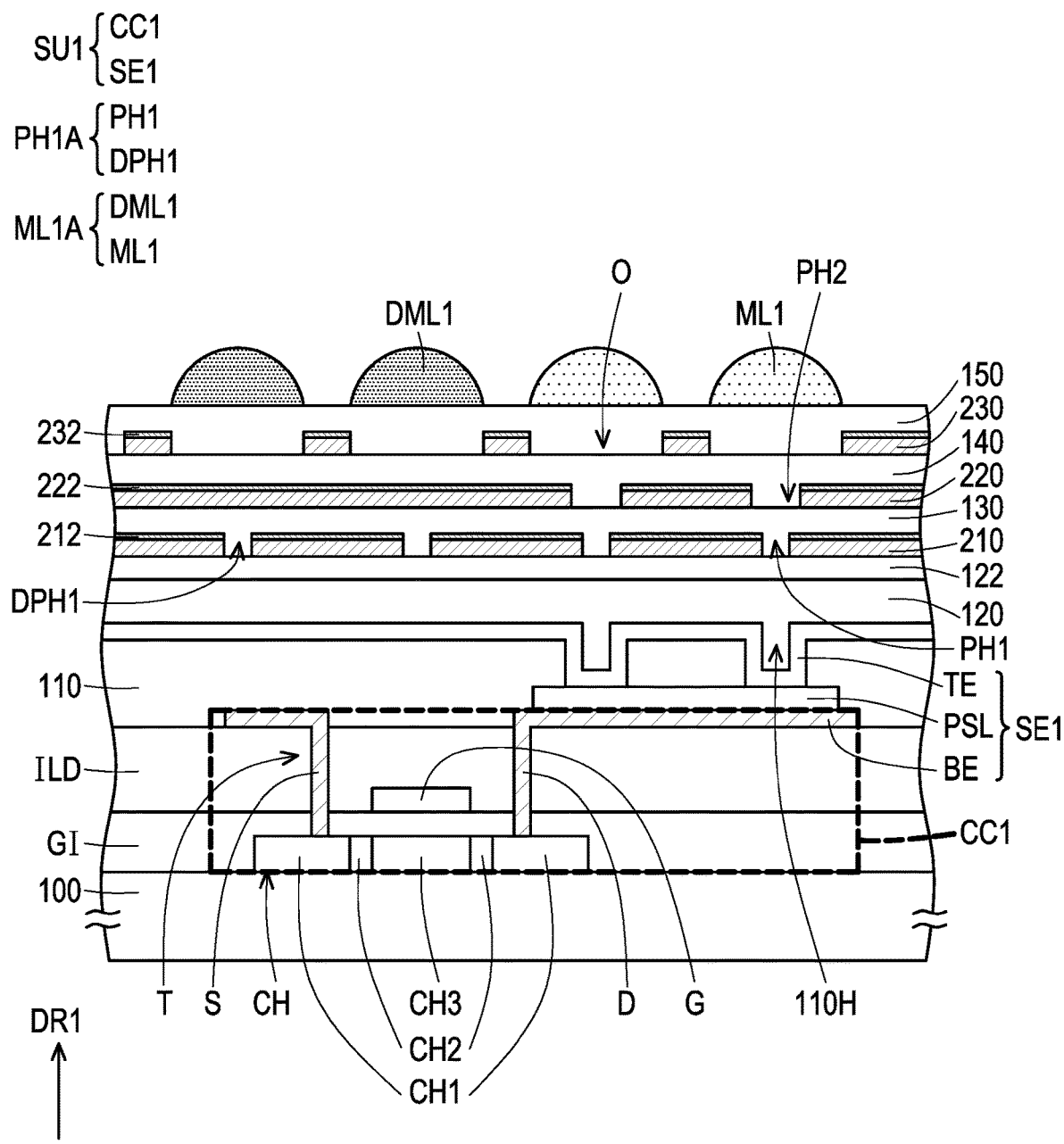
FIG. 6 is a schematic cross-sectional view of a photosensitive device according to an embodiment of the present invention.

FIG. 6 is a schematic cross-sectional view of a photosensitive device according to an embodiment of the present invention. It should be noted that the embodiments of FIG. 6 follow the numeral references and parts of the embodiments of FIG. 1A and FIG. 1B, in which the same or similar numeral references are used to denote the same or similar elements, and the description of the same technical content is omitted. The description of the omitted parts can be found in the preceding embodiments and will not be repeated.

Referring to FIG. 6, in this embodiment, the photosensitive device 60 includes a first photosensitive unit SU1, a first collimator layer 210, and a first lens array ML1A. In this embodiment, the photosensitive device 60 further includes a first substrate 100, a first planarization layer 130, a second collimator layer 220, a second planarization layer 140, a light shielding structure 230, a third planarization layer 150, and a first oxide layer 212, a second oxide layer 222 and a third oxide layer 232.

The first photosensitive unit SU1 is located above the first substrate 100 and includes a first photosensitive component SE1 and a first control circuit CC1. In this embodiment, the first control circuit CC1 includes an active component T. The active component T includes a gate G, a channel layer CH, a source S and a drain D.

The channel layer CH is located above the first substrate 100 and includes a first doped region CH1, a second doped region CH2 and a third doped region CH3, wherein the first doped region CH1, the second doped region CH2 and the third doped region CH3 include, for example, different doping concentrations. The second doped region CH2 is located between the first doped region CH1 and the third doped region CH3. The gate G is overlapping with the third doped region CH3, and the gate insulating layer GI is located between the gate G and the channel layer CH. The interlayer dielectric layer ILD is located on the gate G and the gate insulating layer GI. The source S and the drain D are located on the interlayer dielectric layer ILD, and the source S and the drain D are electrically connected to the first doped region CH1.

In some embodiments, the channel layer CH is a single-layer or multi-layer structure, which includes amorphous silicon, polysilicon, microcrystalline silicon, single crystal silicon, organic semiconductor materials, oxide semiconductor materials (e.g., indium zinc oxide, indium gallium zinc oxide or other suitable material or combination of the above) or other suitable material or combination of the above. In some embodiments, the materials of the gate G, the source S and the drain D include chromium, gold, silver, copper, tin, lead, hafnium, tungsten, molybdenum, neodymium, titanium, tantalum, aluminum, zinc and other metals, alloy of the above or other conductive materials. In this embodiment, the active component T is a top gate type thin film transistor, but the invention is not limited thereto. In other embodiments, the active component T is a bottom gate type thin film transistor, a double gate type thin film transistor or other types of thin film transistors.

The first photosensitive component SE1 includes a first electrode BE, a photosensitive layer PSL and a second electrode TE. The first electrode BE is electrically connected to the drain D of the active component T. In this embodiment, the first electrode BE and the drain D belong to the same layer, and the first electrode BE and the drain D are integrally formed, but the invention is not limited thereto. In other embodiments, the first electrode BE and the drain D belong to different layers.

The photosensitive layer PSL is located above the first electrode BE. For example, the photosensitive layer PSL is directly formed on the first electrode BE. In some embodiments, the photosensitive layer PSL includes a semiconductor stack, e.g., a stack including a P-type semiconductor, an intrinsic semiconductor, and an N-type semiconductor. In other embodiments, the material of the photosensitive layer PSL includes a silicon-rich silicon oxide layer, a silicon-rich silicon nitride layer, a silicon-rich silicon oxynitride layer, a silicon-rich silicon carbide layer, a silicon-rich silicon oxycarbide layer, a hydrogenated silicon-rich silicon oxide layer, a hydrogenated silicon-rich silicon nitride layer, a hydrogenated silicon-rich silicon carbide layer, hydrogenated amorphous silicon, hydrogenated microcrystalline silicon, hydrogenated polysilicon or combinations thereof or other photosensitive materials.

The second electrode TE is located on the photosensitive layer PSL. For example, the second electrode TE is directly formed on the photosensitive layer PSL. In this embodiment, the insulating layer 110 is located on the interlayer dielectric layer ILD, the photosensitive layer PSL and the first electrode BE, and the second electrode TE is connected to the photosensitive layer PSL through the openings 110H in the insulating layer 110. In this embodiment, the openings 110H are overlapping with the first pinholes PH1 in the first direction DR1. In some embodiments, the second electrode TE includes a transparent conductive material, such as indium tin oxide, indium zinc oxide, aluminum tin oxide, aluminum zinc oxide, indium gallium zinc oxide, or a stacked layer of at least two of the above or other conductive materials.

The planarization layer 120 is located on the second electrode TE. The buffer layer 122 is located on the planarization layer 120. The first collimator layer 210 is located on the buffer layer 122. The first oxide layer 212 is located on the surface of the first collimator layer 210. The first pinholes PH1 and the first dummy pinholes DPH1 are penetrating through the first collimator layer 210 and the first oxide layer 212. The first planarization layer 130 is located on the first oxide layer 212. The second collimator layer 220 is located on the first planarization layer 130. The second oxide layer 222 is located on the surface of the second collimator layer 220. The second pinholes PH2 are penetrating through the second collimator layer 220 and the second oxide layer 222. The second planarization layer 140 is located on the second oxide layer 222. The light shielding structure 230 is located on the second planarization layer 140. The third oxide layer 232 is located on the surface of the light shielding structure 230. The openings O are penetrating through the light shielding structure 230 and the third oxide layer 232. The third planarization layer 150 is located on the third oxide layer 232. The first lens array ML1A is located on the third planarization layer 150 and is disposed corresponding to the openings O.

In this embodiment, by the arrangement of the first dummy lenses DML1, the problems of uneven distribution of shapes and uneven distribution of thicknesses of the first lenses ML1 can be improved.

What is claimed is:

1. A photosensitive device, comprising:
    a plurality of pixels, wherein each of the plurality of pixels comprises:
        a first photosensitive unit, comprising:
            a first photosensitive component; and
            a first control circuit electrically connected to the first photosensitive component;
        a first collimator layer located above the first photosensitive component and having a first pinhole array, wherein the first pinhole array includes a first pinhole and a first dummy pinhole; and
        a first lens array located above the first collimator layer and comprising a first lens and a first dummy lens, wherein the first lens is overlapping with the first photosensitive component and the first pinhole in a first direction, and the first dummy lens is overlapping with the first dummy pinhole in the first direction, wherein the first dummy lens in one of the plurality of pixels is located between the first lens in the one of the plurality of pixels and the first lens in another one of the plurality of pixels,
    wherein at least one of the plurality of pixels further comprises:
        a second collimator layer located above the first collimator layer, wherein the second collimator layer has a second pinhole overlapping with the first pinhole in the first direction, a diameter of the second pinhole is larger than a diameter of the first pinhole; and
        a first planarization layer located between the first collimator layer and the second collimator layer, and the first planarization layer has a first trench overlapping with the first dummy pinhole, and the second collimator layer is filling into the first trench.

2. The photosensitive device of claim 1, wherein the first dummy lens is not overlapping with the first photosensitive component in the first direction.

3. The photosensitive device of claim 1, wherein the at least one of the plurality of pixels further comprises:
    a second planarization layer located on the second collimator layer; and
    a light shielding structure located on the second planarization layer, wherein the light shielding structure has openings overlapping with the first pinhole and the first dummy pinhole in the first direction, and the first lens and the first dummy lens are respectively disposed in the openings.

4. The photosensitive device of claim 1, wherein the at least one of the plurality of pixels further comprises:
    a second planarization layer located on the second collimator layer; and
    a light shielding structure located on the second planarization layer, wherein the light shielding structure has openings overlapping with the first pinhole and the first dummy pinhole in the first direction; and
    a third planarization layer located on the light shielding structure, wherein the first lens and the first dummy lens are located on the third planarization layer, and the first lens is overlapping with a corresponding opening of the light shielding structure in the first direction.

5. The photosensitive device of claim 1, wherein the second collimator layer is in contact with the first collimator layer.

6. The photosensitive device of claim 1, wherein the at least one of the plurality of pixels further comprises:
    a second photosensitive unit, comprising:
        a second photosensitive component; and
        a second control circuit electrically connected to the second photosensitive component, wherein the first collimator layer has a plurality of first pinholes and a plurality of first dummy pinholes; and
    a plurality of first lenses located above the first collimator layer, and one of the plurality of first lenses is overlapping with the first photosensitive component and one of the plurality of first pinholes in the first direction, and another one of the plurality of first lenses is overlapping with the second photosensitive component and another one of the plurality of first pinholes in the first direction;
    a plurality of first dummy lenses located above the first collimator layer, wherein the plurality of first dummy lenses are respectively overlapping with corresponding first dummy pinholes in the first direction, and are not overlapping with the first photosensitive component and the second photosensitive component; and
    a second planarization layer located on the second collimator layer, and the second planarization layer has a second trench overlapping with the second photosensitive unit, and the first trench is overlapping with the first photosensitive unit.

7. The photosensitive device of claim 1, further comprises:
    a first substrate and a second substrate, wherein there is a gap between the first substrate and the second substrate, wherein the first photosensitive component is located between a first side of the gap adjacent to the first substrate and the first substrate, and the first lens and the first dummy lens are located at a second side of the gap adjacent to the second substrate.

8. The photosensitive device of claim 7, wherein the at least one of the plurality of pixels further comprises:
a spacer located between the first substrate and the second substrate, wherein the first dummy lens is in contact with a top surface of the spacer.

9. The photosensitive device of claim 7, further comprises:
a filter component located between the second substrate and the first lens and between the second substrate and the first dummy lens.

10. The photosensitive device of claim 7, wherein the at least one of the plurality of pixels further comprises:
a second lens located on the first side of the gap, wherein the second lens is overlapping with the first lens in the first direction; and
a second dummy lens located on the first side of the gap, and the second dummy lens is overlapping with the first dummy lens in the first direction.

11. The photosensitive device of claim 10, wherein the at least one of the plurality of pixels further comprises:
a spacer located between the first substrate and the second substrate, wherein the first dummy lens is in contact with a top surface of the spacer, and the spacer covers the second dummy lens.

12. The photosensitive device of claim 1, wherein the first dummy lens and the first dummy pinhole are overlapping with the first control circuit in the first direction.

13. The photosensitive device of claim 1, wherein the first lens array comprises a plurality of first lenses and a plurality of first dummy lenses arranged in an array along a second direction and a third direction, wherein the plurality of first lenses and the plurality of first dummy lenses have a same first pitch in the second direction, and the plurality of first lenses and the plurality of first dummy lenses have a same second pitch in the third direction.

14. The photosensitive device of claim 1, wherein the first lens and the first dummy lens have a same curvature radius, a same thickness and a same material.

15. The photosensitive device of claim 1, wherein the first pinhole array comprises a plurality of first pinholes and a plurality of first dummy pinholes arranged in an array along a second direction and a third direction, wherein the plurality of first pinholes and the plurality of first dummy pinholes have a same first pitch in the second direction, and the plurality of first pinholes and the plurality of first dummy pinholes have a same second pitch in the third direction.

16. The photosensitive device of claim 1, wherein the first pinhole and the first dummy pinhole have a same diameter.

17. The photosensitive device of claim 1, wherein the at least one of the plurality of pixels further comprises:
a first oxide layer located on a surface of the first collimator layer, and the first pinhole and the first dummy pinhole are penetrating through the first collimator layer and the first oxide layer.

18. The photosensitive device of claim 1,
wherein the second collimator layer shields the first dummy pinhole.

* * * * *